(12) United States Patent
Kim

(10) Patent No.: US 8,130,568 B2
(45) Date of Patent: Mar. 6, 2012

(54) METHOD OF PROGRAMMING NONVOLATILE MEMORY DEVICE

(75) Inventor: Ki Seog Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 217 days.

(21) Appl. No.: 12/695,597

(22) Filed: Jan. 28, 2010

(65) Prior Publication Data

US 2010/0191931 A1     Jul. 29, 2010

(30) Foreign Application Priority Data

Jan. 29, 2009   (KR) .................. 10-2009-0006798

(51) Int. Cl.
*G11C 7/00*       (2006.01)
(52) U.S. Cl. .......... 365/189.16; 365/185.14; 365/185.19
(58) Field of Classification Search ............. 365/189.16, 365/185.14, 185.19
See application file for complete search history.

(56) References Cited

U.S. PATENT DOCUMENTS 6,038,166 A * 3/2000 Wong ................. 365/185.03
7,082,056 B2 * 7/2006 Chen et al. .............. 365/185.2

FOREIGN PATENT DOCUMENTS

KR   1020070007293   1/2007

OTHER PUBLICATIONS

Notice of Allowance issued from Korean Intellectual Property Office on Nov. 30, 2010.

* cited by examiner

*Primary Examiner* — Son Dinh
(74) *Attorney, Agent, or Firm* — IP & T Group LLP

(57) ABSTRACT

A method of programming a nonvolatile memory device includes performing a first LSB program operation on memory cells coupled to a selected word line in order to store least significant bit (LSB) data in the memory cells, performing a first most significant bit (MSB) program operation on the memory cells coupled to the selected word line, such that threshold voltages of the memory cells rise up to a temporary target voltage less than a target voltage, performing a second most significant bit (MSB) program operation on memory cells coupled to a neighboring word line neighboring the selected word line in order to store most significant bit (MSB) data in the corresponding memory cells, and performing a third most significant bit (MSB) program operation, after performing the second most significant bit (MSB) program operation, on the memory cells on which the first most significant bit (MSB) program operation has been performed, such that the threshold voltages of the memory cells coupled to the selected word line become higher than the target voltage.

10 Claims, 3 Drawing Sheets

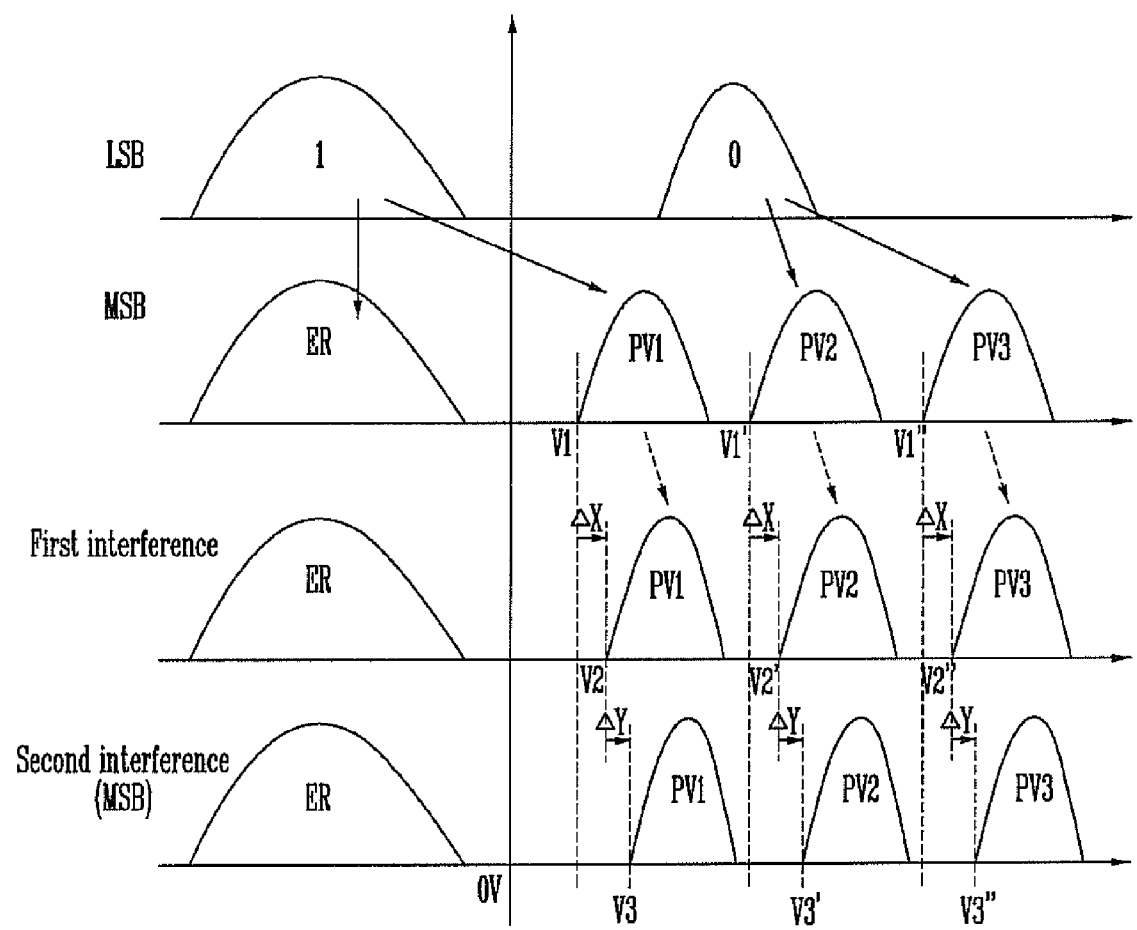

METHOD OF PROGRAMMING NONVOLATILE MEMORY DEVICE

CROSS-REFERENCE TO RELATED APPLICATION

Priority to Korean patent application number 10-2009-0006798 filed on Jan. 29, 2009, the entire disclosure of which is incorporated by reference herein, is claimed.

BACKGROUND

Exemplary embodiments relate to a method of programming a nonvolatile memory device and, more particularly, to a method of programming a nonvolatile memory device which is capable of preventing an increase in the distribution of a threshold voltage.

A nonvolatile memory device includes a memory cell array configured to store data. The memory cell array includes a number of cell strings. FIG. 1 is a diagram illustrating interferences occurring when a program operation in a nonvolatile memory device is performed.

Referring to FIG. 1, the memory cell array of the nonvolatile memory device includes a number of cell strings STe and STo. The cell strings STe or STo include a drain select transistor DST, a source select transistor SST, and a number of memory cells F0 to Fn coupled in series between the drain select transistor DST and the source select transistor SST. The drain of the drain select transistor DST is coupled to a bit line BLe or BLo, and the source of the source select transistor SST is coupled to a global source line CSL. The gates of the drain select transistors DSTs, included in different cell strings STe and STo, are coupled together to form a drain selection line DSL. Likewise, the gates of the source select transistors SSTs, included in different cell strings STe and STo, are coupled together to form a source selection line SSL. Furthermore, the gates of the memory cells F0 to Fn, included in different cell strings STe and STo, are coupled together to form word lines WL0 to WLn, respectively.

A program operation on the memory cells of the nonvolatile memory device may be performed in various manners. For example, because the distance between the cell strings is very narrow, an even cell string STe and an odd cell string STo, classified according to their arrangement, are not selected at the same time. Furthermore, after a program operation is performed on a first memory cell 1 selected by the odd cell string STo and the first word line WL0, a second program operation may be performed on second memory cells 2 coupled to the first word line WL0 and the even cell strings STe. Next, a third program operation may performed on a third memory cell 3 selected by the odd cell string STo and the second word line WL1, and a fourth program operation may be performed on fourth memory cells 4 coupled to the second word line WL1 and the even cell strings STe.

Meanwhile, the first memory cell 1 that is first programmed is subject to interference X and Y while the subsequent program operations are performed on the second and third memory cells 2 and 3. Although the first memory cell 1 may be subject to interference while the program operation is performed on the fourth memory cells 4, the interference resulting from the program operations for the second and third memory cells 2 and 3 is the greatest because of the shorter distance.

FIG. 2 is a diagram illustrating a shift in a threshold voltage resulting from interference when a program operation is performed.

Referring to FIGS. 1 and 2, assuming that a distribution of threshold voltages (i.e., state 'A') is a target threshold voltage distribution in which interference does not occur, a distribution of the threshold voltage can be gradually widened because of interference, as indicated by X and Y.

BRIEF SUMMARY

In an embodiment of the present disclosure, a program operation is performed on a first memory cell using a temporary target voltage less than a target voltage with consideration taken of interferences, which may occur when a program operation is performed on neighboring memory cells. After a program operation is performed on a second memory cell neighboring the first memory cell, a reprogram operation is performed on the first memory cell. Accordingly, an increase of the threshold voltage distribution resulting from interference can be prevented.

A method of programming a nonvolatile memory device according to an aspect of the present disclosure includes performing a first least significant bit (LSB) program operation on memory cells coupled to a selected word line in order to store least significant bit (LSB) data in the memory cells, performing a first most significant bit (MSB) program operation on the memory cells coupled to the selected word line, such that threshold voltages of the memory cells rise up to a temporary target voltage less than a target voltage, performing a second most significant bit (MSB) program operation on memory cells coupled to a word line adjacent to the selected word line in order to store most significant bit (MSB) data in the corresponding the memory cells, and performing a third most significant bit (MSB) program operation, on the memory cells on which the first most significant bit (MSB) program operation has been performed, such that the threshold voltages of the memory cells coupled to the selected word line become higher than the target voltage after performing the second most significant bit (MSB) program operation.

After performing the first least significant bit (LSB) program operation, a second least significant bit (LSB) program operation is performed on the word line adjacent to the selected word line. The first to second least significant bit (LSB) and the first to third most significant bit (MSB) program operations are performed using an incremental step pulse program (ISPP) method. A step voltage of the first most significant bit (MSB) program operation is higher than that of the third most significant bit (MSB) program operation.

A method of programming a nonvolatile memory device according to another aspect of the present disclosure includes performing first and second least significant bit (LSB) program operations respectively on memory cells, included in an even page coupled to a selected word line and on memory cells, included in an odd page coupled to the selected word line, in order to store least significant bit (LSB) data in the memory cells of the even and odd pages, performing first and second most significant bit (MSB) program operations on the memory cells, such that threshold voltages of the memory cells rise up to a first temporary target voltage less than a target voltage, performing a third most significant bit (MSB) program operation on memory cells included in an even page coupled to a neighboring word line adjacent to the selected word line, performing a fourth most significant bit (MSB) program operation, after performing the third most significant bit (MSB) program operation, on the memory cells included in the even page coupled to the selected word line, such that the threshold voltages of the memory cells rise up to the target voltage, performing a fifth most significant bit (MSB) program operation on the memory cells included in an odd page coupled to the neighboring word line, and performing a sixth most significant bit (MSB) program operation, after performing the fifth most significant bit (MSB) program operation, such that the threshold voltages of the memory cells included in the odd page coupled to the selected word line rise up to the target voltage.

After performing the first and second least significant bit (LSB) program operations, third and fourth least significant bit (LSB) program operations are respectively performed on the memory cells, included in the even page coupled to the neighboring word line, and on the memory cells, included in the odd page coupled to the neighboring word line.

After performing the second most significant bit (MSB) program operation, a seventh most significant bit (MSB) program operation is performed on the memory cells included in the even page coupled to the selected word line such that the threshold voltages of the memory cells rise up to a second temporary target voltage. The first and second least significant bit (LSB) program operations and the first to sixth most significant bit (MSB) program operations are performed using an ISPP method.

A step voltage of the first most significant bit (MSB) program operation is higher than that of the third most significant bit (MSB) program operation.

BRIEF DESCRIPTION OF THE DRAWINGS

FIG. 4 is a diagram illustrating threshold voltages when program operations are performed according to the present disclosure.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiment of the disclosure.

Figure 3:
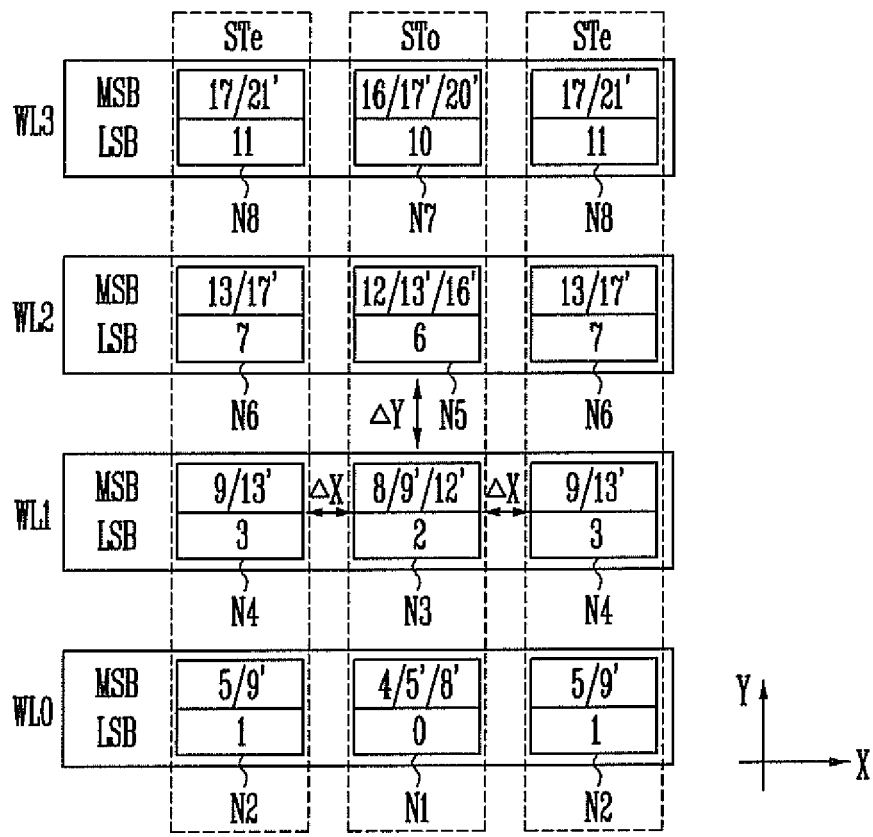
FIG. 3 is a diagram illustrating a method of programming a nonvolatile memory device according to the present disclosure.

FIG. 3 is a diagram illustrating a method of programming a nonvolatile memory device according to the present disclosure.

Figure 1:
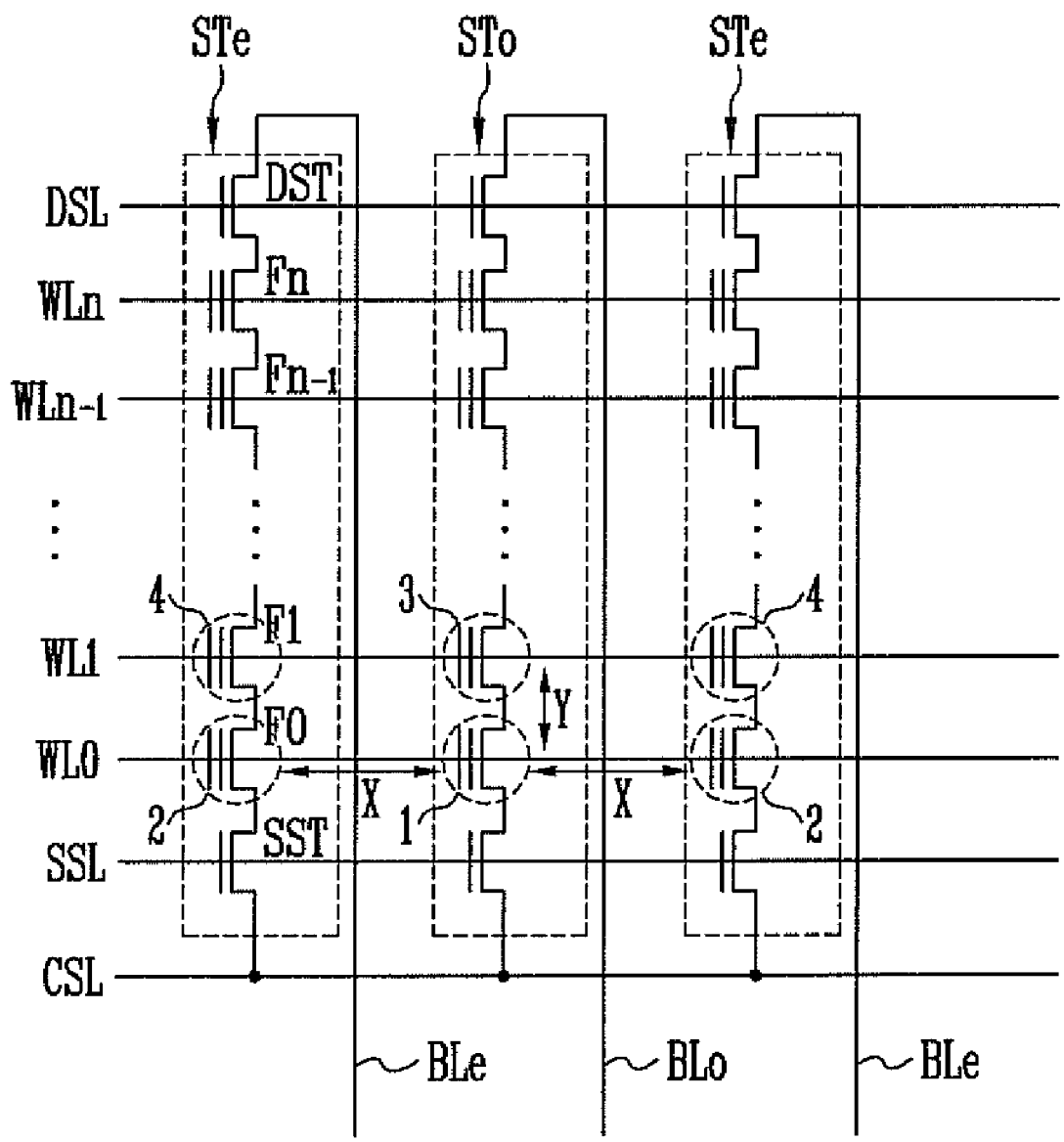
FIG. 1 is a diagram illustrating interferences occurring when an exemplary program operation in a nonvolatile memory device is performed.
Figure 2:
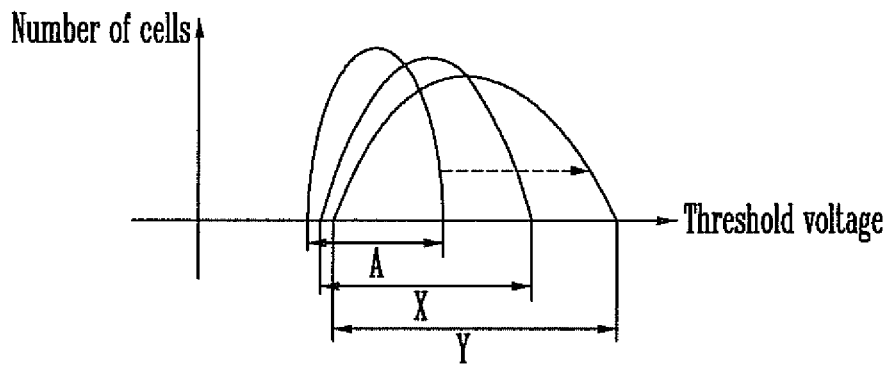
FIG. 2 is a diagram illustrating a shift in the threshold voltage resulting from interference when an exemplary program operation is performed.

More specifically, FIG. 3 shows a sequence of programming a memory cell array, comprising three cell strings STe and STo and four word lines WL0 to WL3. In other words, FIG. 3 shows a sequence of programming 12 memory cells. Although the method of programming illustrated in FIG. 3 may be applied to a memory cell array with higher than 12 memory cells, the following description is provided with reference to only 12 memory cells for the sake of convenience. Referring to FIG. 3, the memory cell array includes a number of cell strings STe and STo. The cell strings STe or STo include a drain select transistor (refer to DST of FIG. 1), a source select transistor (refer to SST of FIG. 1), and a number of memory cells N2, N4, N6, and N8 (in the cell string STe) or N1, N3, N5, and N7 (in the cell string STo) coupled in series between the drain select transistor and the source select transistor.

Referring to FIG. 3, program operations are performed in order according to the numerals written in the memory cells. Numbers followed by an apostrophe indicate supplemental operations, explained in more detail below.

A least significant bit (LSB) program operation is performed using a voltage level less than that of a most significant bit (MSB) program operation. Further, while subsequent programming operations create an interference that has a significant influence on most significant bit (MSB) program operations, subsequent programming operations barely influence least significant bit (LSB) program operations. Referring to FIG. 3, first, a least significant bit (LSB) operation 0 is performed on a first memory cell N1 coupled to the odd cell string STo and the first word line WL0. A least significant bit (LSB) program operation 1 is performed on second memory cells N2 coupled to the first word line WL0 and the even cell strings STe. A least significant bit (LSB) program operation 2 is performed on a third memory cell N3 coupled to the odd cell string STo and the second word line WL1. Next, a least significant bit (LSB) program operation 3 is performed on fourth memory cells N4 coupled to the second word line WL1 and the even cell strings STe. A most significant bit (MSB) program operation 4 is performed on the first memory cell N1 on which the least significant bit (LSB) program operation 0 was performed.

Here, the most significant bit (MSB) program operation 4 is performed using a temporary target voltage less than a target voltage with consideration taken of interferences $\Delta X$ and $\Delta Y$ resulting from program operations for neighboring memory cells. The temporary target voltage preferably is set to be lower than the target voltage by the amount of a shift in the threshold voltage which is increased because of the interferences $\Delta X$ and $\Delta Y$.

Next, a most significant bit (MSB) program operation 5 is performed on the second memory cells N2 adjacent to the first memory cell N1 in the X-axis direction. Here, the most significant bit (MSB) program operation 5 is performed using a temporary target voltage less than a target voltage by taking the interferences $\Delta X$ and $\Delta Y$ resulting from program operations for neighboring memory cells into consideration. Here, the distribution of the threshold voltage of the first memory cell N1 on which the most significant bit (MSB) program operation 4 was performed may be widened because of interferences $\Delta X$ resulting from the most significant bit (MSB) program operation 5. To narrow the distribution of the threshold voltage of the first memory cell N1, a most significant bit (MSB) program operation 5' is performed on the first memory cell N1 using a reference voltage which is higher than the temporary target voltage, but less than the target voltage.

Next, a least significant bit (LSB) program operation 6 is performed on a fifth memory cell N5 coupled to the odd cell string STo and the third word line WL2. A least significant bit (LSB) program operation 7 is then performed on sixth memory cells N6 coupled to the even cell strings STe and the third word line WL2. A most significant bit (MSB) program operation 8 is performed on the third memory cell N3 on which the least significant bit (LSB) program operation 2 was performed. The most significant bit (MSB) program operation 8 is performed using a temporary target voltage less than a target voltage by taking the interferences $\Delta X$ and $\Delta Y$ resulting from program operations on neighboring memory cells into consideration. Here, the distribution of the threshold voltage of the first memory cell N1 can be widened because of interference $\Delta Y$ in the Y-axis direction resulting from the most significant bit (MSB) program operation 8. To narrow the distribution, a most significant bit (MSB) program operation 8' is performed on the first memory cell N1 using a target voltage, thereby completing the program operation on the first memory cell N1.

Next, a most significant bit (MSB) program operation 9 is performed on the fourth memory cells N4 coupled to the even cell strings STe and the second word line WL1. The most significant bit (MSB) program operation 9 is performed using a temporary target voltage less than the target voltage by taking the interferences ΔX and ΔY resulting from program operations on neighboring memory cells into consideration. Here, the distributions of the threshold voltages of the second memory cells N2, neighboring the fourth memory cells N4 in the Y-axis direction, and the distribution of the threshold voltage of the third memory cell N3, neighboring the fourth memory cells N4 in the X-axis direction, can be widened because of interferences ΔX and ΔY resulting from the most significant bit (MSB) program operation 9. To narrow the distributions, a most significant bit (MSB) program operation 9' is performed on the third memory cell N3 and the second memory cells N2 using a reference voltage which is higher than the temporary target voltage, but less than the target voltage. In the case in which the second memory cell N2 is included in the first or last cell string of the memory cell array, the most significant bit (MSB) program operation 9' preferably is performed using the target voltage.

Next, a least significant bit (LSB) program operation 10 is performed on a seventh memory cell N7 coupled to the odd cell string STo and the fourth word line WL3. A least significant bit (LSB) program operation 11 is then performed on eighth memory cells N8 coupled to the even cell strings STe and the fourth word line WL3. Next, a most significant bit (MSB) program operation 12 is performed on the fifth memory cell N5 coupled to the odd cell string STo and the third word line WL2. The most significant bit (MSB) program operation 12 is performed using a temporary target voltage less than a target voltage by taking the interference ΔX and ΔY resulting from program operations for neighboring memory cells into consideration. Here, the distribution of the threshold voltage of the third memory cell N3 on which the most significant bit (MSB) program operation 8 was performed and which was influenced by the interference resulting from the most significant bit (MSB) program operation 9 for the fourth memory cells N4 can be increased because of re-interference ΔY resulting from the most significant bit (MSB) program operation 12. To narrow the distribution of the threshold voltage of the third memory cell N3, a most significant bit (MSB) program operation 12' is performed on the third memory cell N3 using the target voltage, thereby completing the program operation on the third memory cell N3.

Meanwhile, most of the memory cells are subject to interference twice resulting from program operations on neighboring memory cells in the X- and Y-axis directions, except for memory cells included in the first and last cell strings of the memory cell array, which are subject to interference once resulting from program operations on memory cells neighboring in the Y-axis direction. Accordingly, most significant bit (MSB) program operations performed on respective memory cells for the first time are preferably performed by setting different temporary target voltages.

A shift in the threshold voltage according to the above-described program operations is described in more detail below.

FIG. 4 is a diagram illustrating threshold voltages when program operations are performed according to the present disclosure.

Referring to FIG. 4, in the case in which a program operation is performed using an MLC method, a program state can be classified into a number of periods. For example, the program state can be classified into one erase period ER, a first program period PV1, a second program period PV2, and a third program period PV3.

For convenience of description, a first memory cell to be programmed is described as an example.

The threshold voltage of the first memory cell is raised by performing a least significant bit (LSB) program operation on the first memory cell, such that a distribution of the threshold voltage of the first memory cell, belonging to the erase period ER, becomes a program state.

A least significant bit (LSB) program operation is then performed on memory cells to be programmed with threshold voltages, belonging to the second program period PV2 or the third program period PV3, such that a distribution of the threshold voltages of the memory cells, belonging to the erase period ER, becomes a program state.

Next, a first most significant bit (MSB) program operation MSB1 is performed on the first memory cell. The first most significant bit (MSB) program operation MSB1 preferably is performed using a first reference voltage (any one of V1, V1', and V1") (i.e., a temporary target voltage) less than a third reference voltage (any one of V3, V3', and V3") (i.e., a target voltage) by taking interferences resulting from program operations on neighboring memory cells into consideration. That is, in the case in which the first memory cell is subject to interference twice resulting from program operations on neighboring memory cells, the first reference voltage (any one of V1, V1', and V1") can be set with consideration given to the fact that a distribution of the threshold voltage of the first memory cell may be increased as a result of interferences. For example, the first reference voltage (any one of V1, V1', and V1") can be set to have a voltage level less than that of the third reference voltage (any one of V3, V3', and V3") by the amount of a shift in the threshold voltage caused by interferences in the X and Y directions (ΔX and ΔY).

Next, a most significant bit (MSB) program operation is performed on second memory cells adjacent to the first memory cell in the X-axis direction. In this case, the distribution of the threshold voltage of the first memory cell can be widened (by ΔX) because of interference resulting from the most significant bit (MSB) program operation for the second memory cells. To narrow the threshold voltage distribution of the first memory cell, a second most significant bit (MSB) program operation MSB2 is performed on the first memory cell using a second reference voltage (any one of V2, V2', and V2"). The second reference voltage (any one of V2, V2', and V2") is preferably set to have a voltage level less than the third reference voltage (any one of V3, V3', and V3") at least as much as the amount of a shift (ΔY) in the distribution of the threshold voltage with consideration taken of the influence of interferences that may occur when a program operation is performed on a third memory cell adjacent to the first memory cell in the Y-axis direction. That is, the second reference voltage (any one of V2, V2', and V2") is set to be higher than the first reference voltage (any one of V1, V1', and V1"), but less than the third reference voltage (any one of V3, V3', and V3").

Next, a most significant bit (MSB) program operation is performed on the third memory cell adjacent to the first memory cell in the Y-axis direction. At this time, the threshold voltage distribution of the first memory cell can be widened (by ΔY) because of interference resulting from the most significant bit (MSB) program operation. To narrow the threshold voltage distribution of the first memory cell, a third most significant bit (MSB) program operation MSB3 is performed on the first memory cell using the third reference voltage (any one of V3, V3', and V3") (i.e., the target voltage), thereby completing the program operation on the first memory cell.

As described above, a program operation is performed on a selected memory cell using a temporary target voltage less than a target voltage. If a distribution of the threshold voltage of the memory cell is influenced by interference, a re-program operation is performed on the memory cell, with a raised temporary target voltage in order to narrow the threshold voltage distribution. As described above, since an interference phenomenon is employed, the degree of integration of nonvolatile memory devices can be increased, and a margin between threshold voltage distributions of program periods can be secured. Accordingly, reliability of the nonvolatile memory device can be improved.

Furthermore, program operations are performed by taking advantage of interferences occurring when program operations are performed on neighboring memory cells. Thus, additional manufacturing processes and circuits are not required. Accordingly, the degree of integration of nonvolatile memory devices can be increased and a distribution of the threshold voltage of a program state can be narrowed. Further, when the program operations are performed, the same program operations are performed on flag cells such that a program state of each of the memory cells is stored and voltages for program verification operations and read operations can be determined based on the program state. Consequently, reliability of the nonvolatile memory device can be improved.

What is claimed is:

1. A method of programming a nonvolatile memory device, the method comprising:
    performing a first least significant bit (LSB) program operation on memory cells coupled to a selected word line in order to store least significant bit (LSB) data in the memory cells;
    performing a first most significant bit (MSB) program operation on the memory cells coupled to the selected word line, such that threshold voltages of the memory cells rise up to a temporary target voltage less than a target voltage;
    performing a second most significant bit (MSB) program operation on the memory cells coupled to a word line adjacent to the selected word line in order to store most significant bit (MSB) data in the corresponding memory cells; and
    performing a third most significant bit (MSB) program operation, on the memory cells on which the first most significant bit (MSB) program operation has been performed, such that the threshold voltages of the memory cells coupled to the selected word line become higher than the target voltage after performing the second most significant bit (MSB) program operation.

2. The method of claim 1, further comprising performing a second least significant bit (LSB) program operation on the word line adjacent to the selected word line, after performing the first least significant bit (LSB) program operation.

3. The method of claim 1, wherein the first to second least significant bit (LSB) and the first to third most significant bit (MSB) program operations are performed using an incremental step pulse program (ISPP) method.

4. The method of claim 3, wherein a step voltage of the first most significant bit (MSB) program operation is higher than that of the third most significant bit (MSB) program operation.

5. A method of programming a nonvolatile memory device, the method comprising:
    performing first and second least significant bit (LSB) program operations respectively on memory cells, included in an even page coupled to a selected word line and on memory cells, included in an odd page coupled to the selected word line, in order to store least significant bit (LSB) data in the memory cells of the even and odd pages;
    performing first and second most significant bit (MSB) program operations on the memory cells, such that threshold voltages of the memory cells rise up to a first temporary target voltage less than a target voltage;
    performing a third most significant bit (MSB) program operation on memory cells included in an even page coupled to a neighboring word line adjacent to the selected word line;
    performing a fourth most significant bit (MSB) program operation, after performing the third most significant bit (MSB) program operation, on the memory cells included in the even page coupled to the selected word line, such that the threshold voltages of the memory cells rise up to the target voltage;
    performing a fifth most significant bit (MSB) program operation on the memory cells included in an odd page coupled to the neighboring word line; and
    performing a sixth most significant bit (MSB) program operation, after performing the fifth most significant bit (MSB) program operation, such that the threshold voltages of the memory cells included in the odd page coupled to the selected word line rise up to the target voltage.

6. The method of claim 5, further comprising performing third and fourth least significant bit (LSB) program operations, after performing the first and second least significant bit (LSB) program operations, respectively on the memory cells, included in the even page coupled to the neighboring word line, and on the memory cells, included in the odd page coupled to the neighboring word line.

7. The method of claim 5, further comprising performing a seventh most significant bit (MSB) program operation, after performing the second most significant bit (MSB) program operation, on the memory cells included in the even page coupled to the selected word line, such that the threshold voltages of the memory cells rise up to a second temporary target voltage.

8. The method of claim 5, wherein the first and second least significant bit (LSB) program operations and the first to sixth most significant bit (MSB) program operations are performed using an ISPP method.

9. The method of claim 8, wherein a step voltage of the first most significant bit (MSB) program operation is higher than that of the third most significant bit (MSB) program operation.

10. The method of claim 8, wherein whenever the first and second least significant bit (LSB) program operations and the first to sixth most significant bit (MSB) program operations are performed, the same program operations are performed on flag cells.

* * * * *